United States Patent
Mimuro et al.

(10) Patent No.: US 7,030,433 B2
(45) Date of Patent: Apr. 18, 2006

(54) SOLID-STATE IMAGING DEVICE AND METHOD OF MANUFACTURING THE SAME

(75) Inventors: Ken Mimuro, Tonami (JP); Mikiya Uchida, Tonami (JP); Mototaka Ochi, Tonami (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/962,261

(22) Filed: Oct. 8, 2004

(65) Prior Publication Data

US 2005/0082631 A1    Apr. 21, 2005

(30) Foreign Application Priority Data

Oct. 16, 2003  (JP) .............................. 2003-356590

(51) Int. Cl.
*H01L 31/062* (2006.01)
*H01L 31/113* (2006.01)

(52) U.S. Cl. ........................ 257/290; 257/291; 257/292
(58) Field of Classification Search .......... 257/290–292
See application file for complete search history.

(56) References Cited

U.S. PATENT DOCUMENTS

| | | | | |
|---|---|---|---|---|
| 5,514,887 | A * | 5/1996 | Hokari | 257/222 |
| 6,023,081 | A * | 2/2000 | Drowley et al. | 257/292 |
| 6,100,556 | A * | 8/2000 | Drowley et al. | 257/292 |
| 6,136,629 | A * | 10/2000 | Sin | 438/48 |
| 6,504,193 | B1 * | 1/2003 | Ishiwata et al. | 257/291 |
| 6,521,920 | B1 * | 2/2003 | Abe | 257/223 |
| 6,690,423 | B1 | 2/2004 | Nakamura et al. | |
| 6,724,022 | B1 * | 4/2004 | Yoshida | 257/233 |
| 2003/0234432 | A1 * | 12/2003 | Song et al. | 257/440 |
| 2004/0046193 | A1 * | 3/2004 | Park et al. | 257/292 |

FOREIGN PATENT DOCUMENTS

JP        11-274450     10/1999

* cited by examiner

*Primary Examiner*—Jerome Jackson
*Assistant Examiner*—Jesse A. Fenty
(74) *Attorney, Agent, or Firm*—Hamre, Schumann, Mueller & Larson, P.C.

(57) ABSTRACT

A solid-state imaging device includes: a plurality of N-type photodiode regions formed inside a P-type well; a gate electrode having one edge being positioned adjacent to each of the photodiode regions; a N-type drain region positioned adjacent to the other edge of the gate electrode; an element-isolating portion having a STI structure, and a gate oxide film having a thickness of not more than 10 nm. One edge of the gate electrode overlaps the photodiode region. First, second and third regions are formed on a surface portion extending from the photodiode region to the drain region, in conditions such that the first region is disposed with a predetermined distance from one edge of the gate electrode and has a P-type first concentration $C1$, the second region is disposed with one edge positioned adjacent to the first region and the other edge overlapping the gate electrode and has a P-type second concentration $C2$, and the third region is disposed with one edge positioned adjacent to the second region and the other edge positioned adjacent to the drain region and has a P-type third concentration $C3$, wherein $C1>C2>C3$ or $C1 \approx C2>C3$. The readout characteristic at a low voltage is satisfactory, and image defects such as white flaws and dark current are suppressed sufficiently.

3 Claims, 3 Drawing Sheets

(PROR ART)

(PROR ART)

(PROR ART)

ness of the Si—SiO₂
SOLID-STATE IMAGING DEVICE AND METHOD OF MANUFACTURING THE SAME

FIELD OF THE INVENTION

The present invention relates to a solid-state imaging device that uses an active MOS sensor. Particularly, the present invention relates to a solid-state imaging device that enables readout at a low voltage and suppresses image defects (especially for example, white flaws and dark current).

BACKGROUND OF THE INVENTION

A solid-state imaging device using an active MOS sensor is configured such that a signal detected by a photodiode is amplified at a transistor in each pixel, and the solid-state imaging device is characterized by its high sensitivity. A most serious problem for the solid-state imaging device is a reverse-direction leakage current at a pn junction of a silicon semiconductor. This leakage current, which cannot be isolated from a signal current generated by incident light, becomes a noise and degrades the performance of the solid-state imaging device. This leakage current is caused in part by stress applied to the silicon substrate.

FIG. 4 illustrates a silicon substrate 101 on which a gate insulating film 102 and a gate electrode 103 are formed. In this structure, a gate-edge region 104 extending from an edge of the gate electrode 103 to the periphery was applied with stress that causes leakage current in the vicinity of the surface of the silicon substrate 101. In fact, a crystal defect 105 caused by stress was observed inside this gate-edge region 104. Such a crystal defect was not found in the part under the gate electrode 103. In light of this, when designing a high-performance solid-state imaging device, the conventional emphasis has been to suppress a leakage current generated at the part of the gate-edge region 104. Since this gate-edge region 104 is also a via point for electric charge at a time of reading signal charge out from a photodiode formed at the left of the gate electrode 103 in FIG. 3, a condition for facilitating the charge readout and a condition for suppressing the leakage current will be traded off in the design.

With a recent trend toward fine processing of silicon semiconductors, it has been found that a leakage current can be caused even when stress is applied to a part other than the above-mentioned region. As shown in FIG. 5, it has been found that, when a gate insulating film 102a that is thinner than a conventional one is formed, a leakage current generated at an under-gate region 106 is bigger than that generated at a conventional gate-edge region 104. Among the leakage currents generated at the under-gate region 106, a leakage current that flows into the photodiode region 107 will cause a problem, while a leakage current 110 that flows into a drain region 109 will not become a noise and thus it does not cause a problem. Therefore, an object has been to suppress a leakage current 108 that flows into the photodiode region 107 from the area under the gate electrode 103, and at the same time, to design the trade-off for facilitating readout of signal charge from the photodiode.

Next, a structure of a cross section of a cell for a conventional solid-state imaging device will be described below by referring to FIG. 6. FIG. 6 is a cross-sectional view of a cell of a conventional solid-state imaging device (see, for example, JP 11 (1999)-274450). In FIG. 6, a P-well 2 is formed of a Si substrate 1, and a N-type photodiode region 3 for a photoelectric conversion is formed inside the P-well 2. One edge of the gate electrode 4 is positioned adjacent to the N-type photodiode region 3. The lower part of the gate electrode 4 has a MOS transistor structure, in which a gate oxide film 5 and a threshold controlling implantation region 6 for a transistor are formed. And a N-type drain region 7 is formed adjacent to the other edge of the gate electrode 4. Electrons that have been photoelectrically converted are stored in the N-type photodiode region 3, transferred to the N-type drain region 7, and detected as signals. On the upper surface of the N-type photodiode region 3, a high-concentration P-type diffusion layer 8 is formed adjacent to one edge of the gate electrode 4, and a high-concentration P-type diffusion layer 9 is formed adjacent to the P-type diffusion layer 8. The high-concentration P-type diffusion layer 9 is a surface-shield layer for shielding the upper surface of the photodiode, and it is formed to suppress influences of crystal defects and metal pollution on the interface state of the Si—SiO₂ interface. Elements such as the photodiode and a plurality of MOS transistors are isolated from each other by an element-isolating portion 10.

In the above-mentioned conventional art, the concentration of the P-type diffusion layer 8 in the vicinity of the gate is set lower than the concentration of the P-type diffusion layer 9 forming the surface-shield layer, thereby improving the readout characteristic. However, when the concentration of the P-type diffusion layer 8 in the vicinity of the gate electrode 4 is reduced, the interface state of the Si—SiO₂ interface and the active level in the Si substrate 1 cannot be inactivated sufficiently, which may cause problems such as image defects (e.g., white flaws and dark current).

SUMMARY OF THE INVENTION

Therefore, with the foregoing in mind, it is an object of the present invention to provide a solid-state imaging device that has an improved readout characteristic at a low voltage and that suppresses image defects sufficiently.

A solid-state imaging device of the present invention includes: a plurality of N-type photodiode regions that are formed inside a P-type well of a Si substrate in order to photoelectrically convert incident light; a gate electrode having one edge positioned adjacent to each of the photodiode regions; a N-type drain region positioned adjacent to the other edge of the gate electrode; an element-isolating portion having a shallow trench isolation structure for isolating respectively a plurality of elements composed of groups of the respective photodiode regions and MOS transistors; and a gate oxide film having a thickness of not more than 10 nm. For achieving the object, the gate electrode has one edge portion overlapping the photodiode region; and a first region, a second region and a third region are formed on a surface portion extending from the upper portion of the photodiode region to the drain region in conditions such that the first region is disposed at a predetermined distance from one edge of the gate electrode and has a P-type first concentration C1, the second region is disposed with one edge positioned adjacent to the first region and the other edge overlapping the gate electrode in a certain region and has a P-type second concentration C2, and the third region is disposed with one edge positioned adjacent to the second region and the other edge positioned adjacent to the drain region and has a P-type third concentration C3, with the respective concentrations are in a relationship of C1>C2>C3 or C1≈C2>C3.

A method of manufacturing a solid-state imaging device according to the present invention relates to a method of manufacturing the solid-state imaging device having the above-described configuration, characterized in that the respective concentrations are adjusted by controlling a dose of ion implantation for forming the P-type diffusion layers.

Another method of manufacturing a solid-state imaging device according to the present invention relates to a method of manufacturing the solid-state imaging device having the above-described configuration, characterized in that the P-type diffusion layer of the first region is formed so as to extend to the part below the gate electrode by a heat treatment in order to form a P-type diffusion layer of the second region, thereby differentiating the concentration C1 from the concentration C2.

DESCRIPTION OF THE PREFERRED EMBODIMENTS

According to the configuration of the solid-state imaging device of the present invention, by controlling the concentrations of the P-type diffusion layers of the P-type second and P-type third regions separately, a low voltage operation of not higher than 3 V is allowed, and furthermore, image defects can be decreased remarkably.

In the solid-state imaging device of the present invention, it is preferable that a bottom of the P-type diffusion layer of the second region is positioned deeper than bottoms of the P-type diffusion layers of the first region and of the third region. It is also preferable that the bottoms of the P-type diffusion layers of the second region and of the third region are positioned deeper than the bottom of the P-type diffusion layer of the first region.

In a method of manufacturing a solid-state imaging device of the present invention, it is preferable that an acceleration energy of ion implantation during formation of the second region is increased in comparison to formation of the first region and of the third region, thereby positioning the bottom of the P-type diffusion layer of the second region deeper than the bottoms of the P-type diffusion layers of the first region and of the third region. Alternatively, it is preferable that acceleration energies of ion implantation during formation of the second region and the third region are increased in comparison to formation of the first region, thereby positioning the bottoms of the P-type diffusion layers of the second region and of the third region deeper than the bottom of the P-type diffusion layer of the first region.

It is also possible to position the bottoms of the P-type diffusion layers of the second region and the third region deeper than the bottom of the P-type diffusion layer of the first region by a heat treatment carried out after ion implantation during formation of the second region and the third region. The heat treatment can be performed in a step of forming a gate oxide film. It is also preferable that a further step of annealing at 1050° C. for at least 30 minutes is carried out in the step of forming the gate oxide film.

Embodiments of the present invention will be described below specifically by referring to the attached figures.

(First Embodiment)

Figure 1:
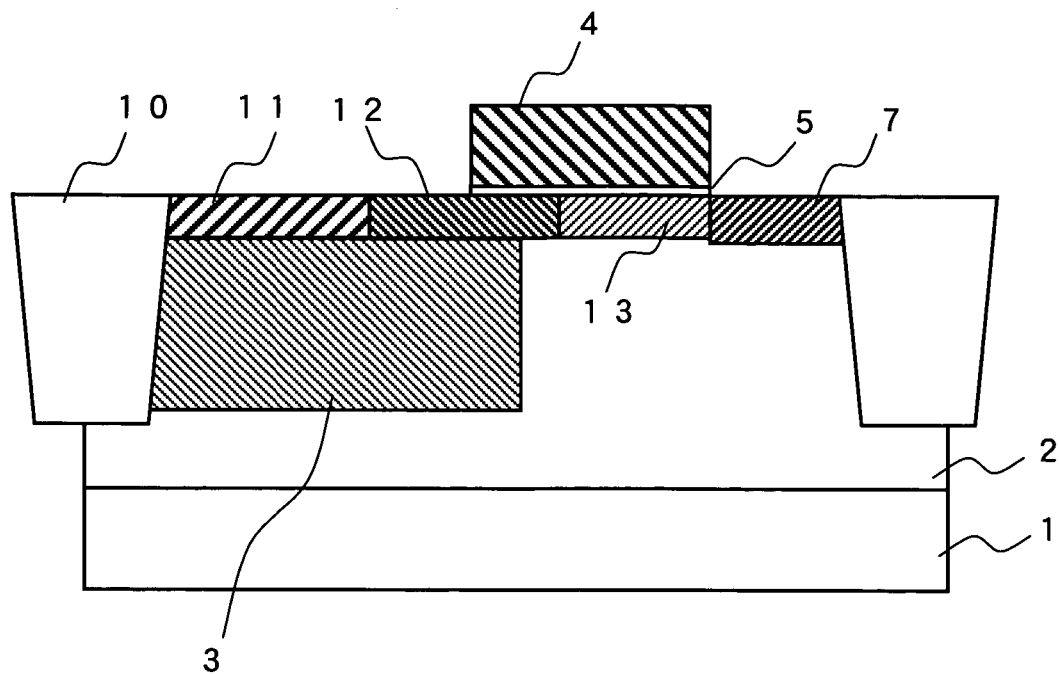
FIG. 1 is a cross-sectional view showing a cell structure of a solid-state imaging device according to a first embodiment of the present invention.

FIG. 1 is a cross-sectional view showing a cell structure of a solid-state imaging device according to a first embodiment. Inside a P-well 2 of a Si substrate 1, a N-type photodiode region 3 for photoelectrically converting incident light is formed. A gate electrode 4 is disposed so that one edge thereof forms an overlapping region with the photodiode region 3. Adjacent to the other edge of the gate electrode 4, an N-type drain region 7 is formed. Under the gate electrode 4, a gate oxide film 5 having a thickness of not more than 10 nm is formed. An element-isolating portion 10 having a STI (Shallow Trench Isolation) structure isolates respective elements composed of a photodiode and a plurality of MOS transistors.

On the surface portion of the photodiode region 3, a P-type first region 11 having a P-type first concentration and a P-type second region 12 having a P-type second concentration are formed. In a region adjacent to the P-type second region 12 and extending to the drain region 7, a P-type third region 13 having a P-type third concentration is formed. The P-type first region 11 is formed in a region extending from the outer periphery of the photodiode region 3 to a position separated by a predetermined distance from a near edge of the gate electrode 4. The predetermined distance, that is the distance between the gate electrode 4 and the P-type first region 11, is preferably 0.2 μm or more. The P-type second region 12 has an edge positioned adjacent to the P-type first region 11, while the other edge overlaps the gate electrode 4. Alternatively, the P-type second region 12 can be positioned adjacent to the gate electrode 4 without overlapping.

In this structure, when the concentrations of the P-type first region 11, the P-type second region 12 and the P-type third region 13 are denoted as C1, C2 and C3 respectively, the relationship of the concentrations is expressed as C1>C2>C3 or C1≈C2>C3.

Here, for obtaining a solid-state imaging device with remarkably reduced image defects (e.g., white flaws and dark current), it is preferable that a dose of a $B^+$ ion implantation for forming the P-type second region 12 is $2.0\times10^{12}$ ions/cm$^2$ or more. Alternatively, a P-type second region 12 with a concentration lower than that of the P-type first region 11 can be formed by diffusing the high-concentration P-type first region 11 to the lower part of the gate electrode 4 by a heat diffusion.

With regard to a readout characteristic, since the N-type photodiode region 3 overlaps the gate electrode 4, a solid-state imaging device capable of being operated at a low voltage can be obtained by controlling a $B^+$ dose for the P-type third region 13. A length (i.e., the transverse distance in FIG. 1) of the overlapping region between the gate electrode 4 and the photodiode region 3 is designed preferably to a range from 0.1 μm to 0.3 μm. Furthermore, it is preferable that a $B^+$ dose for forming the P-type third region 13 is smaller than that for the P-type second region 12.

(Second Embodiment)

Figure 2:
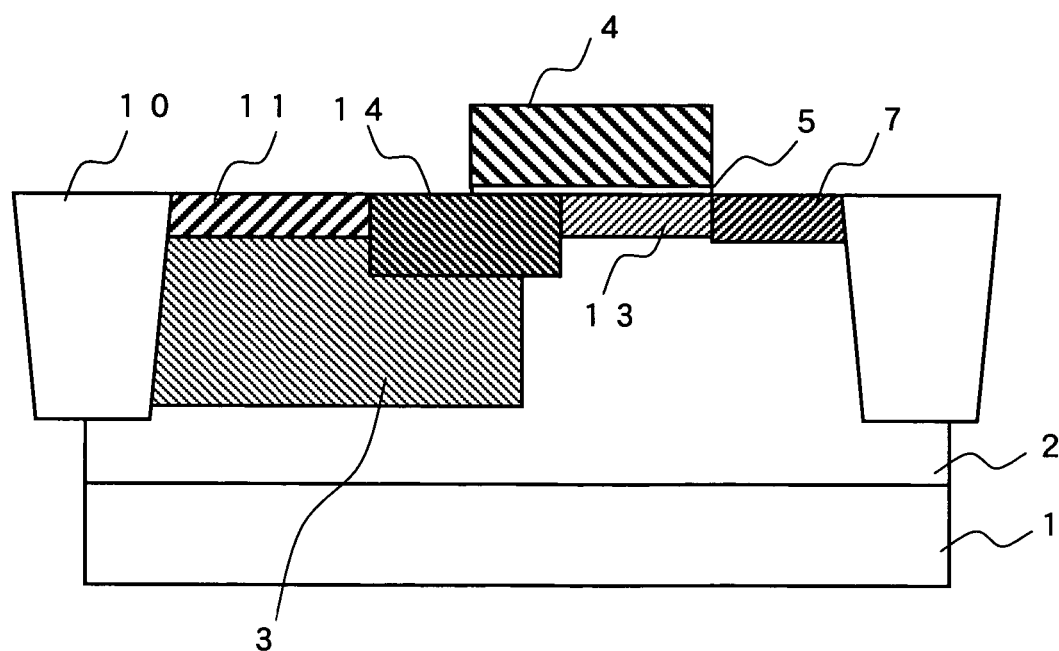
FIG. 2 is a cross-sectional view showing a cell structure of a solid-state imaging device according to a second embodiment of the present invention.

FIG. 2 is a cross-sectional view showing a cell structure of a solid-state imaging device of a second embodiment.

Identical reference numbers are used for components common to those of the first embodiment described above, and detailed explanation will be omitted for these components.

In this embodiment, a P-type second-A region 14 is formed in place of the P-type second region 12 of the first embodiment. The P-type second-A region 14 is characterized in that a bottom of the P-type diffusion layer is positioned deeper than bottoms of the P-type diffusion layers of the P-type first region 11 and the P-type third region 13. For positioning the bottom of the P-type diffusion layer of the P-type second-A region 14 deeper than those of the P-type first region and the P-type third region, the acceleration energy of ion implantation is increased. That is, when E1 denotes an acceleration energy of the P-type first region 11, E2A denotes an acceleration energy of the P-type second-A region 14, and E3 denotes an acceleration energy of the P-type third region 13, the respective acceleration energies are in a relationship of $E1 \approx E3 < E2A$ Due to this structure, in a region where the N-type photodiode region 3 and the gate electrode 4 overlap, it is possible to inactivate an active level generated in the vicinity of the gate electrode 4, thereby suppressing image defects (e.g., white flaws and dark current) further.

(Third Embodiment)

Figure 3:
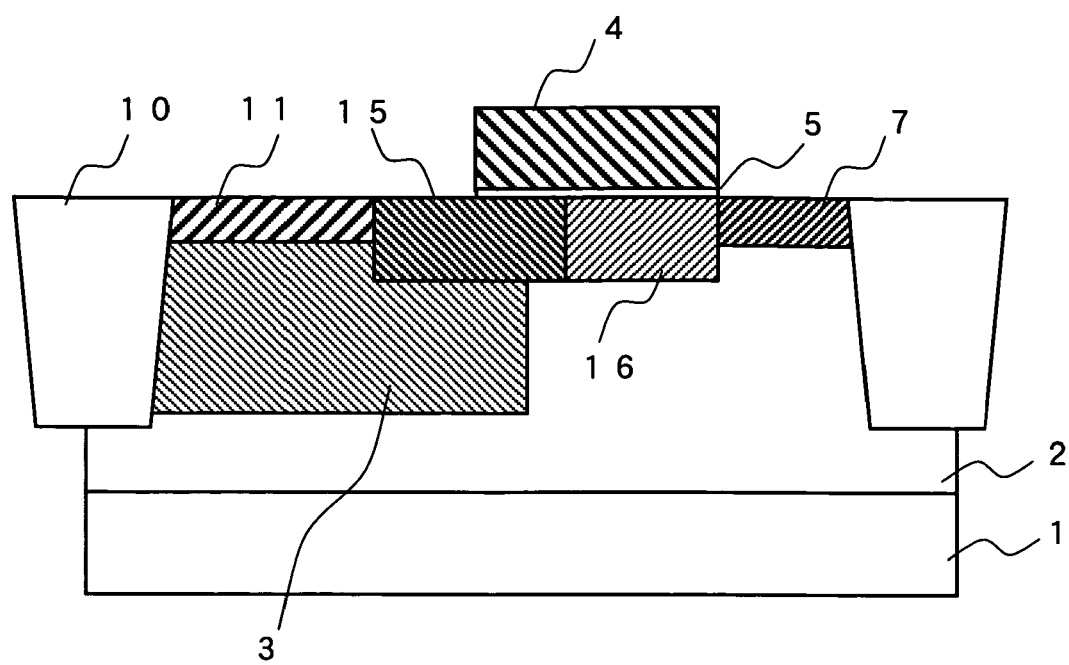
FIG. 3 is a cross-sectional view showing a cell structure of a solid-state imaging device according to a third embodiment of the present invention.
Figure 4:
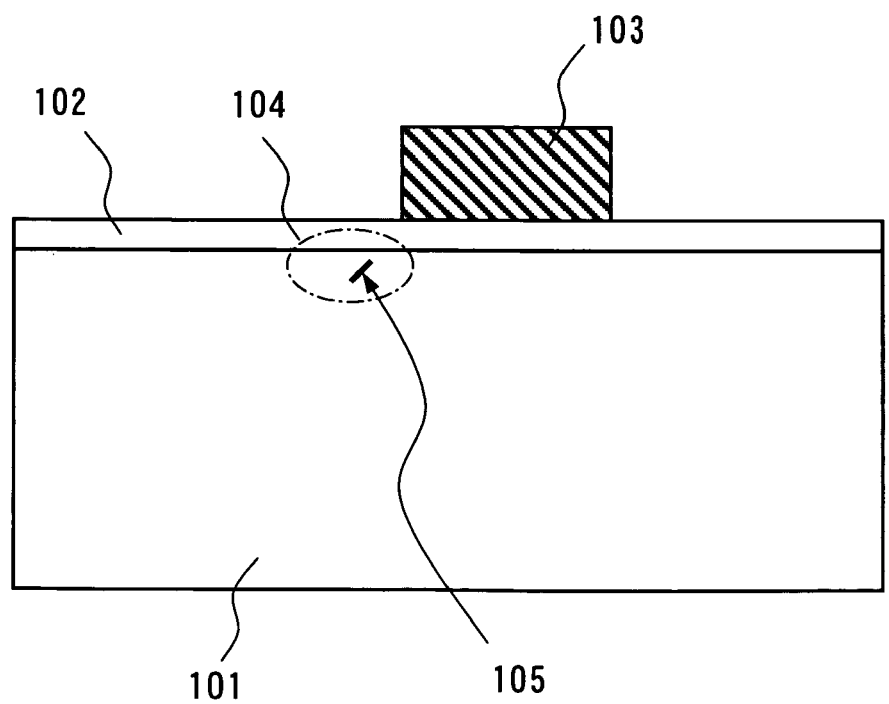
FIG. 4 is a cross-sectional view for explaining the occurrence of image defects in the vicinity of a gate of a solid-state imaging device.
Figure 5:
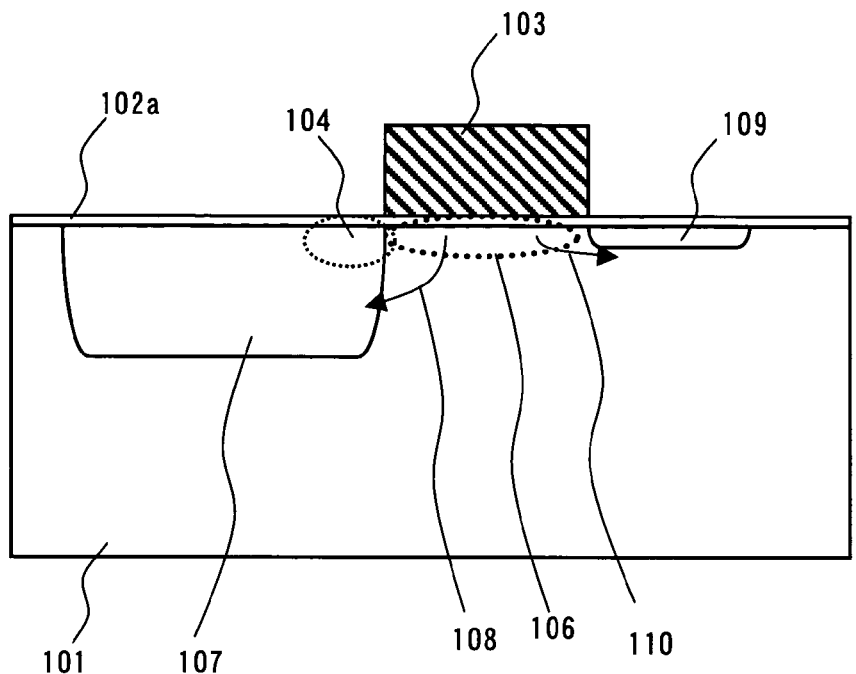
FIG. 5 is a cross-sectional view for explaining the occurrence of an image defects for a case of thin gate insulating film.
Figure 6:
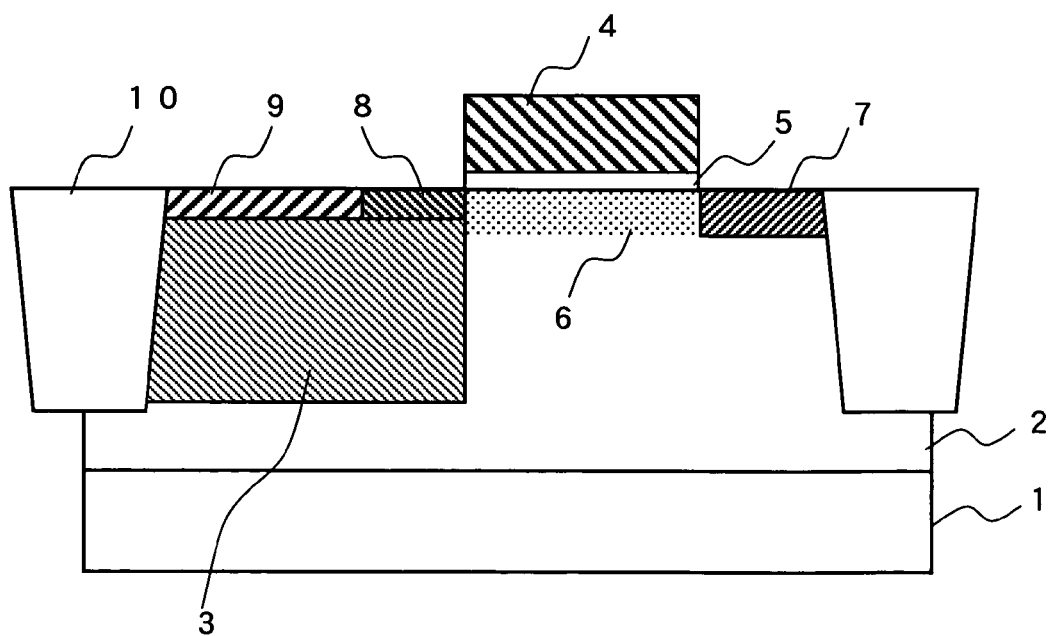
FIG. 6 is a cross-sectional view showing a cell structure of a conventional solid-state imaging device.

FIG. 3 is a cross-sectional view showing a cell structure of a solid-state imaging device according to a third embodiment. Identical reference numbers are used for components common to those of the first embodiment described above, and detailed explanation will be omitted for these components.

In this embodiment, a P-type second-B region 15 and a P-type third-A region 16 are formed in place of the P-type second region 12 and the P-type third region 13 of the first embodiment. This embodiment is characterized in that bottoms of the P-type diffusion layers of the P-type second-B region 15 and of the P-type third-A region 16 are positioned deeper than the bottoms of the P-type first region 11. For obtaining this structure, the energy of ion implantation during formation of the P-type diffusion layers is increased so as to position the bottoms of the P-type diffusion layers of the P-type second-B region 15 and of the P-type third A region 16 deeper than the bottom of the P-type first region 11. That is, when representing the acceleration energies for the P-type first region 11, the P-type second-B region 15 and the P-type third-A region 16 as E1, E2B and E3A respectively, the respective acceleration energies are in a relationship of $E1 < E2B \approx E3A$.

Furthermore, for another method for differentiating the depth, it is possible to extend the P-type diffusion layer downward by a heat treatment carried out after ion implantation, thereby deepening the bottom of the P-type diffusion layer. In this case, the heat treatment can be conducted by heat applied in a step of forming a gate oxide film 5. The effect can be increased further by adding an annealing step to the gate oxidation step. In this case, the annealing temperature is preferably 1050° C. or higher. By addition of annealing, the active level generated in the vicinity of the gate electrode 4 is inactivated in a region where the N-type photodiode region 3 and the gate electrode 4 overlap. Moreover, accumulated stress, particularly, stress that has been accumulated at the element-isolating portion 10 is relieved, which is also effective in suppressing image defects (e.g., white flaws and dark current) arising from crystal defects caused by such stress.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, all changes that come within the meaning and range of equivalency of the claims are intended to be embraced therein.

What is claimed is:

1. A solid-state imaging device comprising:
a plurality of N-type photodiode regions that are formed inside a P-type well of a Si substrate in order to photoelectrically convert incident light;
a gate electrode having one edge positioned adjacent to each of the photodiode regions;
a N-type drain region positioned adjacent to the other edge of the gate electrode;
an element-isolating portion having a shallow trench isolation structure for isolating respectively a plurality of elements composed of groups of the respective photodiode regions and MOS transistors; and
a gate oxide film having a thickness of not more than 10 nm,
wherein the gate electrode has one edge portion overlapping the photodiode region; and
a first region, a second region and a third region are formed on a surface portion extending from the upper portion of the photodiode region to the drain region in conditions such that the first region is disposed at a predetermined distance from one edge of the gate electrode and has a P-type first concentration C1, the second region is disposed with one edge positioned adjacent to the first region and the other edge overlapping the gate electrode in a certain region and has a P-type second concentration C2, and the third region is disposed with one edge positioned adjacent to the second region and the other edge positioned adjacent to the drain region and has a P-type third concentration C3,
with the respective concentrations being in a relationship of $C1 > C2 > C3$ or $C1 \approx C2 > C3$.

2. The solid-state imaging device according to claim 1, wherein a bottom of a P-type diffusion layer of the second region is positioned deeper than bottoms of a P-type diffusion layer of the first region and a P-type diffusion layer of the third region.

3. The solid-state imaging device according to claim 1, wherein bottoms of P-type diffusion layers of the second region and the third region are positioned deeper than a bottom of a P-type diffusion layer of the first region.

* * * * *